(12) United States Patent
Effenberger

(10) Patent No.: US 9,264,071 B2
(45) Date of Patent: Feb. 16, 2016

(54) APPLYING FORWARD ERROR CORRECTION IN 66B SYSTEMS

(71) Applicant: Futurewei Technologies, Inc., Plano, TX (US)

(72) Inventor: Frank J. Effenberger, Colts Neck, NJ (US)

(73) Assignee: Futurewei Technologies, Inc., Plano, TX (US)

(*) Notice: Subject to any disclaimer, the term of this patent is extended or adjusted under 35 U.S.C. 154(b) by 0 days.

(21) Appl. No.: 13/929,867

(22) Filed: Jun. 28, 2013

(65) Prior Publication Data

US 2013/0311856 A1 Nov. 21, 2013

Related U.S. Application Data

(63) Continuation of application No. 13/433,012, filed on Mar. 28, 2012, now Pat. No. 8,533,561, which is a continuation of application No. 11/874,978, filed on Oct. 19, 2007, now Pat. No. 8,171,370.

(60) Provisional application No. 60/865,770, filed on Nov. 14, 2006.

(51) Int. Cl.
*H03M 13/00* (2006.01)
*H03M 13/05* (2006.01)
*H04L 1/00* (2006.01)

(52) U.S. Cl.
CPC ............. *H03M 13/05* (2013.01); *H04L 1/0057* (2013.01); *H04L 1/0079* (2013.01)

(58) Field of Classification Search
CPC .. H03M 13/09; H03M 13/091; H04L 1/0061; H04L 1/0057; H04L 1/0045
USPC .......................................................... 714/758
See application file for complete search history.

(56) References Cited

U.S. PATENT DOCUMENTS

| | | | | |
|---|---|---|---|---|
| 5,594,734 | A * | 1/1997 | Worsley | ............... H04L 12/44 370/395.53 |
| 6,385,713 | B2 | 5/2002 | Yung | |
| 6,606,727 | B1 | 8/2003 | Yang et al. | |

(Continued)

FOREIGN PATENT DOCUMENTS

| CN | 1630207 | 6/2005 |
|---|---|---|
| CN | 101064943 A | 10/2007 |

(Continued)

OTHER PUBLICATIONS

Effenberger, F., et al., "10Gb/s EPON FEC," IEEE 802.3av Task Force, Sep. 2006, 23 pages.

(Continued)

*Primary Examiner* — Albert Decady
*Assistant Examiner* — Enam Ahmed
(74) *Attorney, Agent, or Firm* — Conley Rose, P.C.; Grant Rodolph; Jonathan K. Polk

(57) ABSTRACT

A method and apparatus for applying Forward Error Correction (FEC) in 66b systems. For a user data, the apparatus uses a method comprising the steps of generating one or more data blocks using a 66b code format and the user data; generating one or more FEC parity blocks using the 66b code format, wherein the parity is calculated over the data blocks; and generating an FEC codeword using the data blocks and the FEC parity blocks.

21 Claims, 3 Drawing Sheets

(56) References Cited

U.S. PATENT DOCUMENTS

| | | | |
|---|---|---|---|
| 6,650,638 B1* | 11/2003 | Walker et al. | 370/389 |
| 7,580,637 B2* | 8/2009 | El-Ahmadi et al. | 398/135 |
| 7,685,496 B2* | 3/2010 | Toyoda | 714/758 |
| 7,809,021 B2* | 10/2010 | McClellan | 370/476 |
| 8,136,013 B2 | 3/2012 | Valliappan et al. | |
| 2004/0088633 A1 | 5/2004 | Lida et al. | |
| 2005/0028066 A1 | 2/2005 | Raahemi | |
| 2005/0047433 A1* | 3/2005 | Rizer et al. | 370/464 |
| 2005/0149820 A1 | 7/2005 | Gastaldello et al. | |
| 2007/0147434 A1 | 6/2007 | Toyoda | |
| 2007/0206589 A1* | 9/2007 | Yiling et al. | 370/389 |
| 2008/0182579 A1 | 7/2008 | Wang et al. | |
| 2008/0228941 A1 | 9/2008 | Popescu et al. | |
| 2008/0267131 A1 | 10/2008 | Kangude et al. | |
| 2010/0095185 A1 | 4/2010 | Ganga et al. | |

FOREIGN PATENT DOCUMENTS

| | | |
|---|---|---|
| CN | 101198155 A | 6/2008 |
| CN | 101247647 A | 8/2008 |
| CN | 101370267 A | 2/2009 |
| EP | 2129147 A1 | 12/2009 |
| WO | 2004073222 A1 | 8/2004 |
| WO | 2005048520 A1 | 5/2005 |
| WO | 2007149013 A1 | 12/2007 |
| WO | 2008084395 A1 | 7/2008 |

OTHER PUBLICATIONS

Lindstrom, M., "I.S on LTE Latency Analysis," R1-072648, 3GPP TSG RAN WG1 Meeting #49bis, Jun. 25-29, 2007, 12 pages.

Mandin, J., "Framing and Integration for Stream-Based FEC," IEEE 802.3av Task Force, www.ieee802.org/3/av/public/2006_09_mandin_1.pdf, Sep. 19, 2006, 13 pages.

"Part 3: Carrier Sense Multiple Access with Collision Detection (CSMA/CD) Access Method and Physical Layer Specifications," Information Technology—Telecommunications and Information Exchange Between Systems—Local and Metropolitan Area Network—Specific Requirements, IEEE 802.3, 2005, 417 pages.

Raahemi, B., "Error Correction on 64/66 Bit Encoded Links," Electrical and Computer Engineering 2005 Canadian Conference, Saskatoon, Canada, May 1-3, 2005, pp. 412-416.

Toyoda, H., et al., "100-Gb/s Physical-Layer Architecture for Next-Generation Ethernet,"IEICE Transactions on Communications, vol. E89-B, No. 3, Mar. 1, 2006, pp. 696-703.

Notice of Allowance dated Dec. 29, 2011, 24 pages, U.S. Appl. No. 11/874,978, filed Oct. 19, 2007.

Office Action dated Dec. 22, 2010, 9 pages. U.S. Appl. No. 11/874,978, filed Oct. 19, 2007.

Office Action dated Jun. 17, 2011, 26 pages, U.S. Appl. No. 11/874,978, filed Oct. 19, 2007.

Office Action dated Jun. 15, 2012, 19 pages, U.S. Appl. No. 13/433,012, filed Mar. 28, 2012.

Notice of Allowance dated Mar. 29, 2013, 21 pages, U.S. Appl. No. 13/433,012, filed Mar. 28, 2012.

Foreign Communication From a Related Counterpart Application, Chinese Application No. 200780036690.4, Office Action dated Mar. 3, 2011, 4 pages.

Foreign Communication From a Related Counterpart Application, Chinese Application No. 200780036690.4, Partial English Translation of Chinese Office Action dated Mar. 3, 2011, 4 pages.

Foreign Communication From a Related Counterpart Application, Chinese Application No. 200780036690.4, Chinese Office Action dated Sep. 27, 2012, 4 pages.

Foreign Communication From a Related Counterpart Application, Chinese Application No. 200780036690.4, Partial English Translation of Chinese Office Action dated Sep. 27, 2012, 5 pages.

Foreign Communication From a Related Counterpart Application, Chinese Application No. 200780036690.4, Chinese Office Action dated May 4, 2012, 4 pages.

Foreign Communication From a Related Counterpart Application. Chinese Application No. 200780036690.4, Partial English Translation of Chinese Office Action dated May 4, 2012, 5 pages.

Foreign Communication From a Related Counterpart Application, Chinese Application No. 200910148040.X, Chinese Office Action dated May 29, 2012, 8 pages.

Foreign Communication From a Related Counterpart Application, Chinese Application No. 200910148040.X, Partial English Translation of Chinese Office Action dated May 29, 2012, 8 pages.

Foreign Communication From a Related Counterpart Application, European Application No. 07817178.2, European Office Action dated Jan. 26, 2012, 4 pages.

Foreign Communication From a Related Counterpart Application, European Application No. 07817178.2, Extended European Search Report dated Apr. 29, 2010, 7 pages.

Foreign Communication From a Related Counterpart Application, European Application No. 10791541.5, Extended European Search Report dated Jul. 5, 2012, 9 pages.

Foreign Communication From a Related Counterpart Application, European Application No. 07817178.2, Eupean Office Action dated May 17, 2013, 4 pages.

Foreign Communication From a Related Counterpart Application, Japanese Application No. 2009-535550, Office Action dated Nov. 8, 2011, 3 pages.

Foreign Communication From a Related Counterpart Application, Japanese Application No. 2009-535550, English Translation of Japanese Office Action dated Nov. 8, 2011, 5 pages.

Foreign Communication From a Related Counterpart Application, Japanese Application No. 2009-535550, Japanese Office Action dated Jun. 26, 2012, 2 pages.

Foreign Communication From a Related Counterpart Application, Japanese Application No. 2009-535550, English Translation of Japanese Office Action dated Jun. 26, 2012, 2 pages.

Foreign Communication From a Related Counterpart Application, PCT Application No. PCT/CN2007/070987, International Search Report dated Jan. 31, 2008, 3 pages.

Foreign Communication From a Related Counterpart Application, PCT Application No. PCT/CN2007/070987, Written Opinion dated Jan. 31, 2008, 3 pages.

Foreign Communication From a Related Counterpart Application, PCT Application PCT/CN2010/074288, International Search Report dated Oct. 8, 2010, 5 pages.

Foreign Communication From a Related Counterpart Application, PCT Application PCT/CN2010/074288, Written Opinion dated Oct. 8, 2010, 7 pages.

* cited by examiner

APPLYING FORWARD ERROR CORRECTION IN 66B SYSTEMS

CROSS-REFERENCE TO RELATED APPLICATIONS

This application is a continuation of U.S. patent application Ser. No. 13/433,012 filed Mar. 28, 2012 by Frank J. Effenberger and titled "Method and Apparatus for Applying Forward Error Correction in 66B Systems," which claims priority to U.S. patent application Ser. No. 11/874,978 filed Oct. 19, 2007 by Frank J. Effenberger and titled "Method and Apparatus for Applying Forward Error Correction in 66B System," which claims priority to U.S. Provisional Patent Application No. 60/865,770 filed Nov. 14, 2006 by Frank J. Effenberger and titled "Method and Apparatus for Applying Forward Error Correction in 66B System," all of which are incorporated by reference in their entirety.

TECHNICAL FIELD

The present invention relates generally to network communications, and more particularly, to a method and apparatus for applying forward error correction in 66b systems.

BACKGROUND

An Ethernet Passive Optical Network (EPON) is an emerging access network technology that provides low-cost methods of deploying optical access lines between a carrier's Central Office (CO) and a customer site. EPONs seek to bring forth a full-service access network that delivers data, video, and voice over a single optical access system.

Optional Forward Error Correction (FEC) methods are used to improve communication reliabilities in error prone environments. In a 10 Gb/s EPON system, there is a demand for use of FEC. In an FEC process, an EPON frame may be encapsulated into an FEC frame carrying parity and other FEC bits. Use of an FEC results in an increased link budget, which enables higher bit rates, longer optical terminal to optical network unit distances, as well as higher split ratios for a single Passive Optical Network (PON) tree.

A general consensus of the industry is that an FEC method should have the following properties: 64b66b code should be unchanged; line rate should be unchanged; and systematic block FEC codes should be used.

Therefore, what is needed is a method and apparatus that provides FEC satisfying all the criterion described above in a 66b system.

SUMMARY

The present invention discloses a method and apparatus for applying Forward Error Correction (FEC) in 66b systems. For a user data, the present invention uses a method having the steps of generating one or more data blocks using a 66b code format and the user data; generating one or more FEC parity blocks using the 66b code format, wherein the parity is calculated over the data blocks; and generating an FEC codeword using the data blocks and the FEC parity blocks.

The following description and drawings set forth in detail a number of illustrative embodiments of the invention. These embodiments are indicative of but a few of the various ways in which the present invention may be utilized.

BRIEF DESCRIPTION

For a more complete understanding of this disclosure, reference is now made to the following brief description, taken in connection with the accompanying drawings and detailed description, wherein like reference numerals represent like parts.

Figure 3:
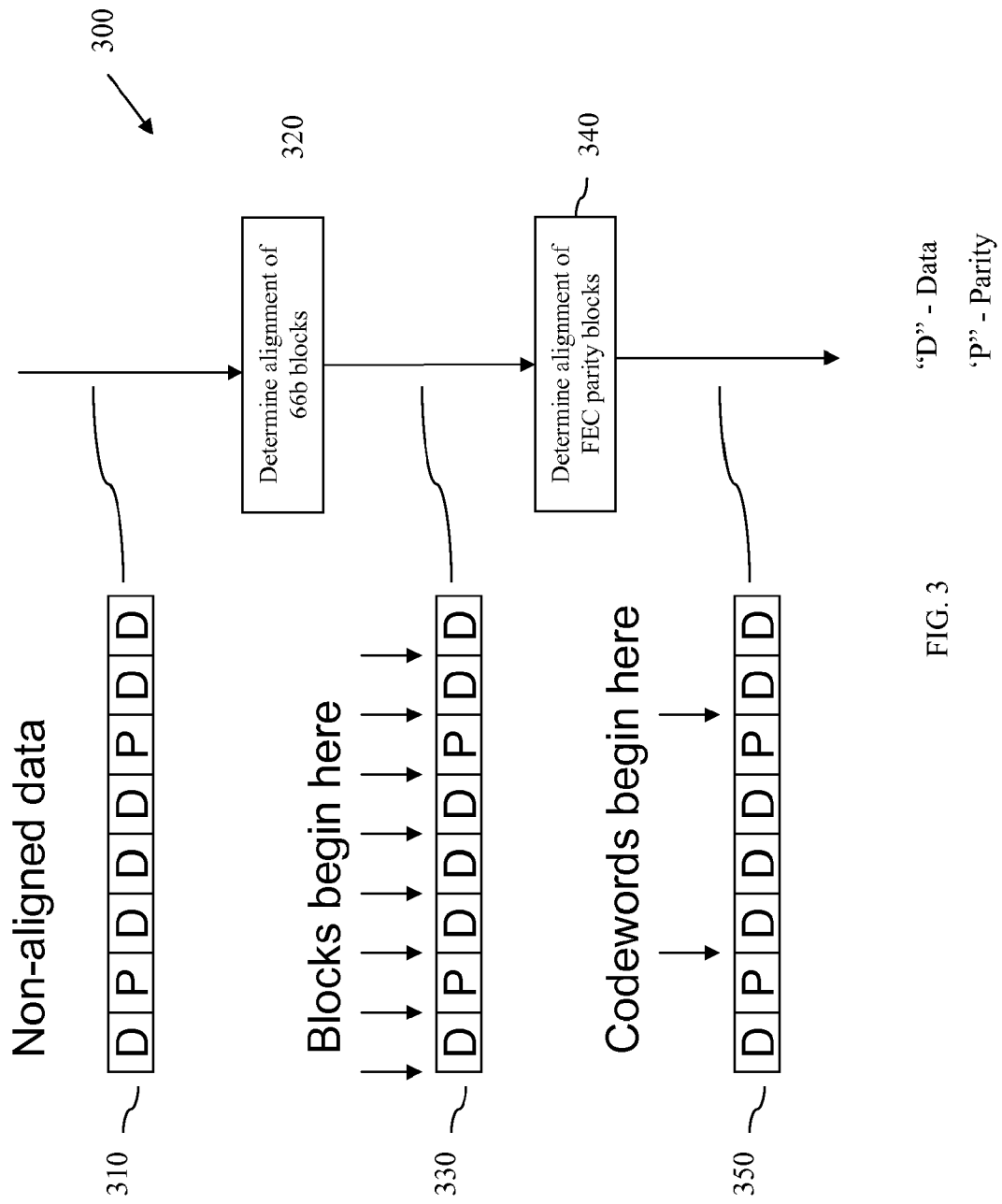

FIG. 3 a flow chart of an embodiment for delineating an FEC codeword is depicted.

DETAILED DESCRIPTION OF THE INVENTION

The following discussion is presented to enable a person skilled in the art to make and use the invention. The general principles described herein may be applied to embodiments and applications other than those detailed below without departing from the spirit and scope of the present invention as defined herein. The present invention is not intended to be limited to the embodiments shown, but is to be accorded the widest scope consistent with the principles and features disclosed herein.

The present invention provides a system for applying Forward Error Correction (FEC) in 66b systems. The present invention satisfies all criterion specified for an FEC method, by using a 64b66b format code to carry both data and parity of an FEC code.

Figure 1:
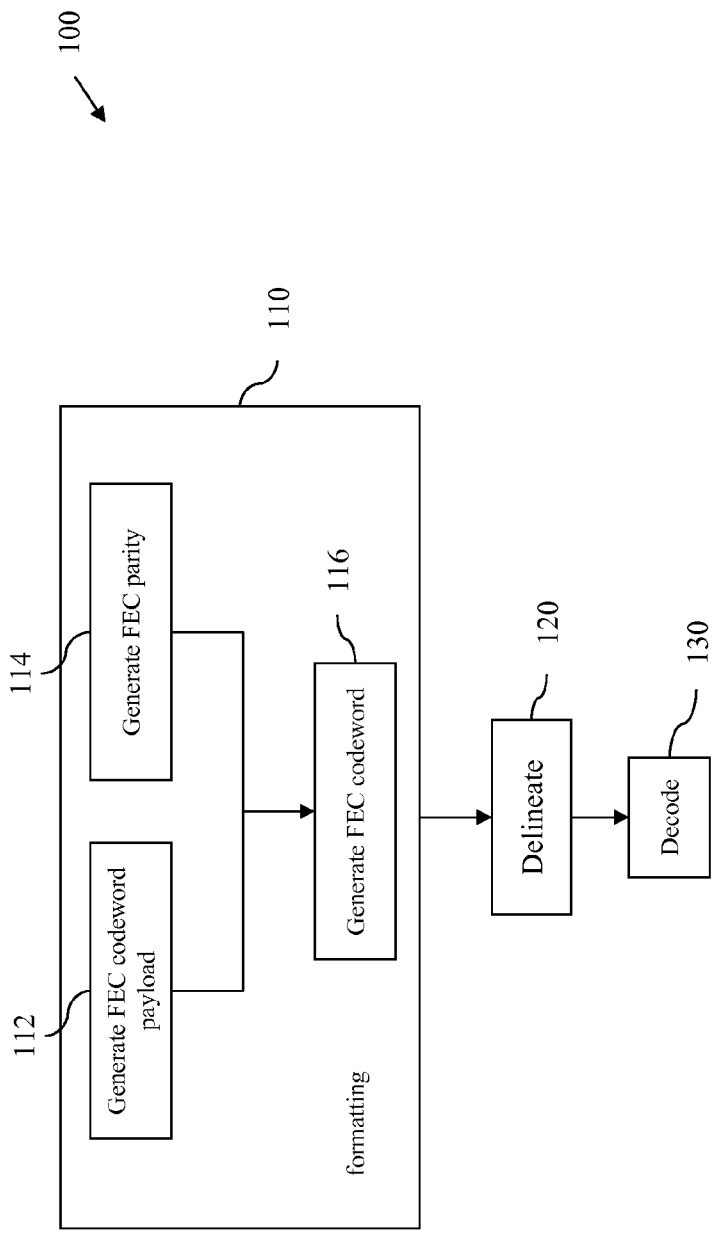
FIG. 1 is a block diagram illustrating an embodiment for applying FEC using a 64b66b code format in an Ethernet Passive Optical Network (EPON).

Referring to FIG. 1, a block diagram 100 for applying FEC using a 64b66b code format in an Ethernet Passive Optical Network (EPON) is illustrated according to one embodiment of the present invention. In this embodiment, an FEC codeword may be generated for a user data in a formatting process 110 on transmitting side, utilizing a 66b code format. On a receiver side, the FEC codeword may be delineated in 120, and sent for decoding in 130.

In the formatting process of 110, an FEC codeword may be generated. In one embodiment of generating an FEC codeword, as shown in FIG. 1, some number X of 64b units of user data may be formatted into the same number X of 66b data block(s) in 112, to form an FEC codeword payload. In 114, an FEC algorithm may be used to calculate FEC parity over the entire codeword payload. The parity may then be packaged into a number Y of 66b block(s).

A 66b code may mark each block with a header that indicates either a data block or a code block. Selection of a "data" or a "code" framing header may be arbitrary, and may be performed to preserve normal sequence rules that apply to a 66b code. In one embodiment, this header marking function may essentially be unused for the parity blocks. Alternatively, this function may be used to provide a special header marking for the parity blocks, as identification of the parity blocks being different from the data blocks, facilitating locating of the parity blocks.

Figure 2:
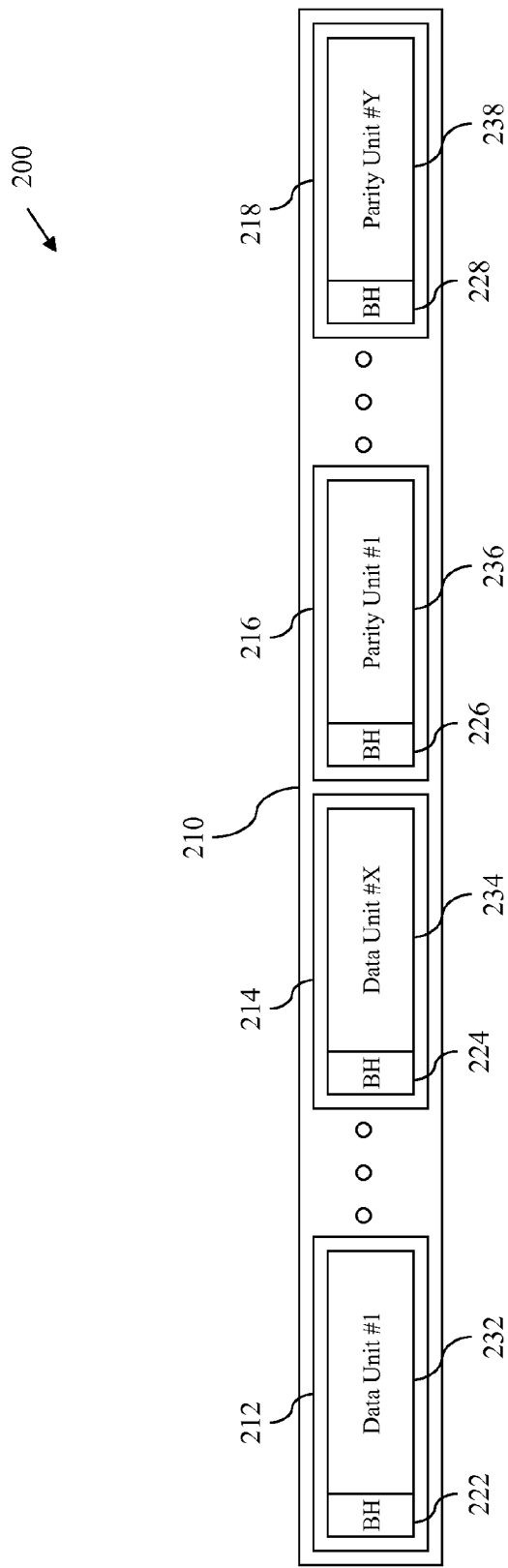
FIG. 2 is diagram illustrating an embodiment of a codeword format for applying FEC using a 64b66b code format in an EPON.

The resulting output of the formatting process 110 may produce a codeword of X+Y 66b blocks in 116. Referring to FIG. 2, a codeword format 200 for applying FEC using a 64b66b code format in an EPON is illustrated according to one embodiment of the present invention. In this embodiment, a number of FEC parity blocks are appended after the FEC data blocks.

In FIG. 2, a codeword 210 is composed of a number of 66b blocks. The first X blocks 212 through 214 are data blocks, composed of data or code block headers 222 through 224, and data units 232 through 234, respectively. The following Y blocks 216 through 218 are parity blocks, composed of parity block headers 226 through 228, and parity units 236 through 238, respectively.

A formatting process may be located below a 64b66b Physical Coding Sublayer (PCS). A standard 64b66b PCS emits blocks at a period of 6.4 ns. An FEC sublayer may need to insert Y blocks every (X+Y)*6.4 ns. To resolve this rate mismatch, a Media Address Control (MAC) may slow down a peak payload data rate to X/(X+Y)*10 Gb/s. This may be accomplished by stretching an inter-packet gap by an appropriate amount for each packet, so that extra idle blocks are inserted after each run of non-idle blocks. The FEC sub layer may then use a First In First Out (FIFO) to decouple the PCS rate and the FEC rate. The FIFO input receives the blocks from the 64b66b PCS layer. During runs of non-idle blocks, the FIFO may begin to fill. The FIFO may then drain during the subsequent extra idle blocks that were inserted. The result may be that the FIFO would always return to a nearly empty state before the next packet begins.

Delineation of an FEC codeword may be performed in various ways. In one embodiment, a 64b66b framing state machine may be used to find an initial block alignment of the FEC codeword; and a second method may be used to find the FEC parity blocks of the FEC codeword. Then an FEC decoding, such as the decoding process 130 in FIG. 1, may be applied to both data and 64b66b framing bits, thereby delivering low error rate to a 64b66b Ethernet framing state machine.

FIG. 3 illustrates an embodiment of a flow chart 300 for delineating an FEC codeword, wherein a receiver may employ a two-step process. An incoming stream of bits 310 (composed of many FEC codewords 350) comes to the receiver is unaligned. First, in step 320, the receiver may look for a repeating pattern of 66*b* blocks in the FEC codeword. This constitutes looking for a 66b block alignment that always produces a "01" or a "10" pattern in the first two bits of a 66b block. Algorithms for determining this alignment with a defined level of certainty are well known in the art. For example in an algorithm, a certain number of successful codes in a row may be declared a successful alignment, while finding a certain number of non-successful codes may be declared a bad alignment, whereupon the algorithm tries a new alignment. The result of this first aligning step is to produce an aligned stream of blocks 330, which are then handed to a second step 340.

The second step 340 may delineate the codeword by looking for FEC parity blocks at the end of the FEC codeword. Since the codeword is X+Y blocks long, there are X+Y possible alignments that may be an FEC codeword. An embodiment of an algorithm to find the FEC parity blocks may be a simple hunting algorithm, where an alignment guess is made, and the resulting codeword is decoded. If the decoding process is successful, then codeword alignment is declared to be found. If not, then a new alignment is attempted. Within X+Y tries, the correct codeword alignment will be found.

In an alternative embodiment of an algorithm for determining the codeword alignment, a temporary parity may be calculated on the tentatively-aligned data payload of the FEC codeword received, and the tentatively-aligned parity is compared with the temporary parity. If a match is found, then the alignment of the FEC parity blocks is found.

Using these embodiments of delineation, a locking that is 66 times faster than a pure serial locking may be provided, because there are 66 times fewer possible alignments of an FEC codeword. This is significant, as the computation to do FEC at 10 G is non-trivial.

In another embodiment of the second step 320, if each or all the FEC parity blocks of an FEC codeword, such as the FEC codeword generated in the formatting process 110 in FIG. 1, are provided with a header that may not be normally found in a coded sequence, the header may be used to identify an FEC parity block. For example, as described previously, a 66b code may mark each block with a bit indicating whether this block is a data or a code block. Since the parity blocks in the embodiments of the present invention are in 66b code format, this bit may be used as a marking for identification of a parity block. Therefore, in this case, the parity blocks may be found by looking for the special 66b blocks with the header, i.e., identifying a 66b block using the marking provided.

Using this embodiment of delineation an even faster locking may be provided, because only 2~4 FEC blocks may be needed to locate the parity.

Just as a transmitting side needs a FIFO to decouple an FEC data rate from an MAC rate, a receiver requires a FIFO for the same purpose. However, in the case of the receiver, the FIFO is maintained at nearly full state during periods of idleness. When a non-idle sequence of blocks begins, the FIFO begins to drain, since the output rate to an MAC is faster than the input rate from an FEC decoder. Once the non-data run ends, extra idle blocks may be generated locally and inserted into the FIFO to bring the FIFO back up to full status.

The present invention may be applied to any systematic block FEC code. A FEC code of most interest commercially may be a Reed Solomon (RS) 8 bit code. In an embodiment of implementation of the embodiments of the present invention, 28 66b data blocks may fit within a codeword. This amounts to 231 bytes of FEC data. The RS code may then produce 16 bytes of parity, which may be packaged into 2 66b blocks. The total codeword may then be 30 66b blocks.

One of the advantages of this embodiment is that the resulting codeword is 192 ns long. This happens to be exactly 12 time quanta as defined in the IEEE 802.3 EPON standard. This allows a time granting algorithm to be simpler in many cases, especially when a mixed 1 G and 10 G EPON are used.

In the embodiments of the present invention, payload of an FEC algorithm is an integral number of 66b blocks; parity from an FEC algorithm is encapsulated into an integral number of 66b blocks; and resulting FEC codeword is a 66b coded signal. The 66b format may be used to partially delineate a coded signal; and parity and/or a special 66b format may be used to complete the delineation.

The embodiments of the present invention preserves 64b66b code format on the line. This makes the 10.3125 Gb/s line rate more "rational", rather than just a legacy from a previous protocol. The present invention makes maximal use of framing bits already available.

The previous description of the disclosed embodiments is provided to enable those skilled in the art to make or use the present invention. Various modifications to these embodiments will be readily apparent to those skilled in the art and generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for applying forward error correction (FEC) in a passive optical network (PON), the apparatus comprising:
   a memory; and
   a processor coupled to the memory and configured to:

generate a number X of 66 bit (66b) data blocks using a 66b code format and user data;

generate a number Y of 66b FEC parity blocks using the 66b code format and a Reed-Solomon 8-bit coding, wherein parity is calculated over the 66b data blocks, and wherein the 66b FEC parity blocks each comprise a header; and generate an FEC codeword with a length of (X+Y) 66b blocks using the 66b data blocks and the 66b FEC parity blocks, wherein the number X is an integer and the number Y is 2, 3, or 4.

2. The apparatus of claim 1, wherein the FEC codeword comprises an integer multiple of five 66b blocks.

3. The apparatus of claim 1, wherein the 66b FEC parity blocks are appended to the 66b data blocks.

4. The apparatus of claim 1, wherein the header distinguishes the 66b FEC parity blocks from the 66b data blocks.

5. The apparatus of claim 1, wherein the FEC codeword is delineated by:

determining 66b block alignment in a stream of bits; and determining FEC codeword alignment in a stream of blocks.

6. The apparatus of claim 5, wherein the FEC codeword alignment is determined by one of using a hunting algorithm and identifying the header, and wherein the header distinguishes the 66b FEC parity blocks from the 66b data blocks.

7. The apparatus of claim 5, wherein a 64 bit-66 bit framing state machine is used to obtain an initial block alignment.

8. The apparatus of claim 1, wherein the 66b FEC parity blocks are used to delineate the FEC codeword.

9. An apparatus comprising:

a forward error correction (FEC) encoder configured to:

generate a number X of 66 bit (66b) data blocks using a 66b code format and user data;

generate a number Y of 66b FEC parity blocks using the 66b code format and a Reed-Solomon 8-bit coding, wherein parity is calculated over the 66b data blocks, and wherein the 66b FEC parity blocks each comprise a header; and generate an FEC codeword with a length of (X+Y) 66b blocks using the 66b data blocks and the 66b FEC parity blocks wherein the number X is an integer and the number Y is 2, 3, or 4.

10. The apparatus of claim 9, wherein the FEC codeword comprises an integer multiple of five 66b blocks.

11. The apparatus of claim 9, wherein the 66b FEC parity blocks are appended to the 66b data blocks.

12. The apparatus of claim 9, wherein the header distinguishes the 66b FEC parity blocks from the 66b data blocks.

13. The apparatus of claim 9, wherein the FEC codeword is delineated by:

determining 66b block alignment in a stream of bits; and determining FEC codeword alignment in a stream of blocks.

14. The apparatus of claim 13, wherein the FEC codeword alignment is determined by one of using a hunting algorithm and identifying the header, and wherein the header distinguishes the 66b FEC parity blocks from the 66b data blocks.

15. The apparatus of claim 13, wherein a 64 bit-66 bit framing state machine is used to obtain an initial block alignment.

16. The apparatus of claim 9, wherein one of the 66b code format and the 66b FEC parity blocks are used to delineate the FEC codeword.

17. A method for applying forward error correction (FEC) in a 66 bit (66b) system, comprising:

forming data blocks into a payload portion of an FEC codeword from user data;

FEC encoding the payload portion of the FEC codeword to form FEC parity blocks into a parity portion of the FEC codeword;

combining the payload portion of the FEC codeword and the parity portion of the FEC codeword to form a Reed-Solomon codeword, wherein the parity portion of the FEC codeword follows the payload portion of the FEC codeword; and constructing a transmittable FEC codeword with the Reed-Solomon codeword by adding a header to each FEC parity block, wherein the transmittable FEC codeword comprises a number X of 66b data blocks and a number Y of 66b FEC parity blocks such that the transmittable codeword is (X+Y) 66b blocks long, wherein the number X is an integer and the number Y is 2, 3, or 4, and wherein the header distinguishes between the data blocks and the FEC parity blocks.

18. A method for applying forward error correction (FEC) in a passive optical network (PON), the method comprising:

generating a number X of 66 bit (66b) data blocks using a 66b code format and user data;

generating a number Y of 66b FEC parity blocks using the 66b code format and a Reed-Solomon 8-bit coding, wherein parity is calculated over the 66b data blocks, wherein the 66b FEC parity block each comprise a header; and generating an FEC codeword with a length of (X+Y) 66 blocks using the 66b data blocks and the 66b FEC parity blocks, wherein the number X is an integer and the number Y is 2, 3, or 4.

19. The apparatus of claim 1, wherein the headers of the 66b FEC parity blocks promote locking of the FEC codeword.

20. The apparatus of claim 19, wherein the header for each 66b FEC parity block is either 00 or 11.

21. The apparatus of claim 19, wherein the headers of the 66b FEC parity blocks are 2 bits long, and wherein the 66b data blocks each comprise a 2-bit second header.

* * * * *

UNITED STATES PATENT AND TRADEMARK OFFICE
CERTIFICATE OF CORRECTION

PATENT NO. : 9,264,071 B2
APPLICATION NO. : 13/929867
DATED : February 16, 2016
INVENTOR(S) : Frank J. Effenberger It is certified that error appears in the above-identified patent and that said Letters Patent is hereby corrected as shown below:

In the Claims:

Column 5, Lines 32-45, Claim 9, should read as:
9. An apparatus comprising:
 a forward error correction (FEC) encoder configured to:
  generate a number X of 66 bit (66b) data blocks using a 66b code format and user data;
  generate a number Y of 66b FEC parity blocks using the 66b code format and a Reed-Solomon 8-bit coding, wherein parity is calculated over the 66b data blocks, and wherein the 66b FEC parity blocks each comprise a header; and
  generate an FEC codeword with a length of (X+Y) 66b blocks using the 66b data blocks and the 66b FEC parity blocks,
  wherein the number X is an integer and the number Y is 2, 3, or 4.

Signed and Sealed this
Twenty-first Day of June, 2016

Michelle K. Lee
*Director of the United States Patent and Trademark Office*